United States Patent
Lee

(10) Patent No.: US 7,495,285 B2
(45) Date of Patent: Feb. 24, 2009

(54) FINFETS AND NONVOLATILE MEMORY DEVICES INCLUDING FINFETS

(75) Inventor: Chang-Hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 11/473,487

(22) Filed: Jun. 23, 2006

(65) Prior Publication Data

US 2006/0292781 A1 Dec. 28, 2006

(30) Foreign Application Priority Data

Jun. 23, 2005 (KR) .................. 10-2005-0054688

(51) Int. Cl.
*H01L 29/94* (2006.01)

(52) U.S. Cl. ..................................... 257/324

(58) Field of Classification Search ....................... None
See application file for complete search history.

(56) References Cited

U.S. PATENT DOCUMENTS

| | | | | |
|---|---|---|---|---|
| 6,960,804 B1* | 11/2005 | Yang et al. | .................. | 257/315 |
| 6,962,843 B2* | 11/2005 | Anderson et al. | ........... | 438/212 |
| 7,052,958 B1* | 5/2006 | Fried et al. | .................... | 438/257 |
| 7,087,952 B2* | 8/2006 | Zhu et al. | ..................... | 257/315 |
| 7,091,551 B1* | 8/2006 | Anderson et al. | ........... | 257/324 |
| 7,176,067 B2* | 2/2007 | Jung et al. | ................... | 438/144 |
| 7,183,159 B2* | 2/2007 | Rao et al. | ..................... | 438/258 |
| 7,323,375 B2* | 1/2008 | Yoon et al. | ................... | 438/164 |
| 7,348,246 B2* | 3/2008 | Kim et al. | .................... | 438/284 |
| 7,352,018 B2* | 4/2008 | Specht et al. | ............... | 257/204 |
| 7,352,037 B2* | 4/2008 | Kim et al. | .................... | 257/401 |
| 2003/0197221 A1 | 10/2003 | Shinozaki et al. | ........... | 257/330 |
| 2004/0235300 A1* | 11/2004 | Mathew et al. | .............. | 438/689 |
| 2005/0110087 A1* | 5/2005 | Natzle et al. | ................. | 257/347 |
| 2005/0124099 A1* | 6/2005 | Beintner et al. | ............. | 438/164 |
| 2005/0186742 A1* | 8/2005 | Oh et al. | ...................... | 438/283 |
| 2005/0233565 A1* | 10/2005 | Zhu et al. | .................... | 438/602 |
| 2005/0285186 A1* | 12/2005 | Fujiwara | ..................... | 257/327 |
| 2006/0046355 A1* | 3/2006 | Parekh et al. | ............... | 438/149 |
| 2006/0097310 A1* | 5/2006 | Kim et al. | .................... | 257/321 |
| 2006/0270164 A1* | 11/2006 | Li et al. | ....................... | 438/283 |
| 2006/0286724 A1* | 12/2006 | Anderson et al. | ........... | 438/149 |
| 2006/0292781 A1* | 12/2006 | Lee | ............................. | 438/197 |
| 2007/0085134 A1* | 4/2007 | Anderson et al. | ........... | 257/326 |

FOREIGN PATENT DOCUMENTS

| | | |
|---|---|---|
| JP | 2004-327812 | 11/2004 |
| KR | 1020030065864 | 8/2003 |
| KR | 1020030082390 A | 10/2003 |
| KR | 1020040005331 A | 1/2004 |

* cited by examiner

*Primary Examiner*—M. Wilczewski
*Assistant Examiner*—Swapneel Chhaya
(74) *Attorney, Agent, or Firm*—Myers Bigel Sibley & Sajovec, P.A.

(57) ABSTRACT

A FinFET includes a fin that is on a substrate and extends away from the substrate. A device isolation layer is disposed on the substrate on both sides of the fin. An insulating layer is between the fin and the substrate. The insulating layer is directly connected to the device isolation layer and has a different thickness than the device isolation layer. A gate electrode crosses over the fin. A gate insulating layer is between the gate electrode and the fin. Source and drain regions are on the fins and on opposite sides of the gate electrode. Related nonvolatile memory devices that include FinFETs and methods of making FinFETs and nonvolatile memory devices are also disclosed.

16 Claims, 20 Drawing Sheets

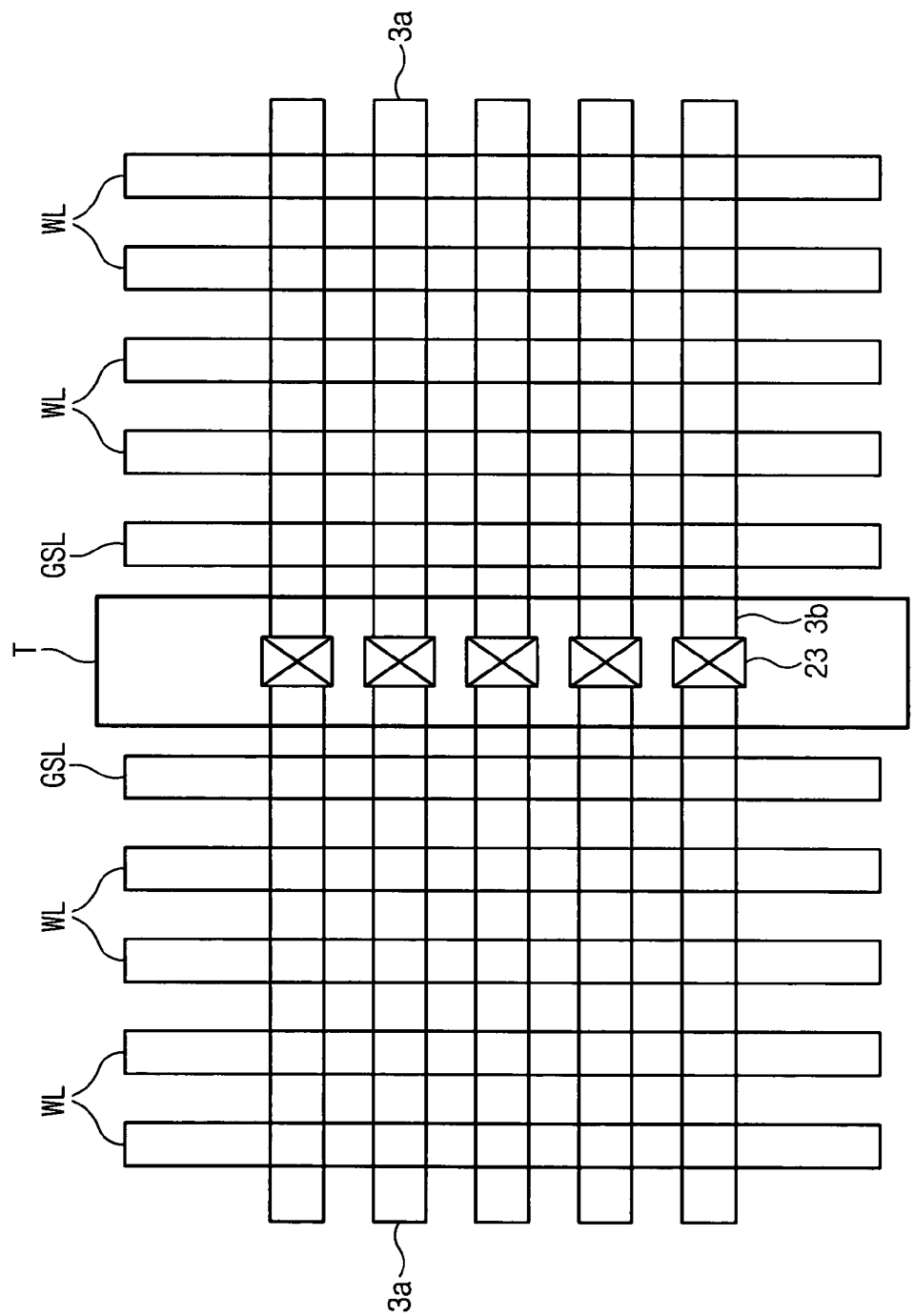

FINFETS AND NONVOLATILE MEMORY DEVICES INCLUDING FINFETS

CROSS REFERENCE TO RELATED APPLICATION

This application claims priority under 35 USC § 119 to Korean Patent Application No. 10-2005-0054688 filed on Jun. 23, 2005, the content of which is incorporated herein by reference in its entirety.

FIELD OF THE INVENTION

The present invention relates to semiconductor devices and methods of forming the same, and more particularly, to fin field effect transistors (FinFETs) and nonvolatile memory devices using FinFETs, and methods of forming the same.

BACKGROUND OF THE INVENTION

As device feature sizes and associated design rules continue to be driven smaller, transistors having a general horizontal channel structure are increasingly more difficult to manufacture. There appears to be some limitations to the ability to scale down horizontal channel structure transistors. One potentially serious limitation is a short channel effect and a drain induced barrier lower (DIBL) effect, which can occur more often as the channel length is shortened. When the channel length is reduced to 50 nm or less in some conventional transistors, the degree of dispersion of the device characteristics increases due to variability in the parameters of the fabrication process. Moreover, if the channel length is reduced to 30 nm or less, it is known to be more difficult for a transistor to exhibit desired operational characteristics because of strong short channel effects and DIBL effects.

In conventional transistors, a gate electrode may be formed over only the horizontal channel so that an electric field is applied asymmetrically to upper and lower portions of the channel. As a result, the gate electrode may not effectively control the transistor between ON/OFF states, and short channel effects due to the reduction of the channel length can become a serious problem.

A double gate transistor is a type of device that has been researched in an attempt to overcome problems associated with transistors having horizontal channel structures. The double gate transistor can have a structure in which the channel is formed to be 30 nm or less thick, and a gate encompasses the channel or is disposed on both sides of the channel. Because the gate electrode is formed on both sides of the thin channel in the double gate transistor, every region of the channel is influenced by the gate electrode. Therefore, because charge flow can be inhibited between a source and a drain when the transistor is turned off, it may be possible to reduce power consumption. Further, it may be possible to effectively control the transistor between ON/OFF states. In the double gate MOS transistor, the width of a silicon layer in which the channel is formed is small, so it is possible to increase the controllability of the gate with respect to the channel. Because the silicon layer can have a width that is in a range of nanometers to tens of nanometers, the double gate transistor is also called a fin field effect transistor (FinFET) due to its shape.

A floating trap type nonvolatile memory device with a FinFET structure will now be explained. Referring to FIG. 17, a plurality of fins 101 are arranged in the shape of lines which extend away from a semiconductor substrate 100, and a device isolation layer 102 is disposed between the fins 101. A plurality of word lines 110, which are parallel with one another, cross over the fins 101. Between the word lines 110 and the fins 101, there are interposed a tunnel insulating layer 104, a charge storage layer 106, and a blocking insulating layer 108 which are stacked in sequence.

When programming a first cell transistor TR1, a program voltage is applied to a corresponding word line 110 and a predetermined voltage, e.g., 0 V, is applied to a channel region of the first cell transistor TR1 so that charges are trapped in the charge storage layer 106 of the first cell transistor TR1 in response to a large voltage difference. At this time, a channel region of an adjacent second cell transistor TR2 is maintained to be a floating voltage higher than 0 V, for example. However, if the device isolation layer 102 is thin, a channel is also formed under the device isolation layer 102 and a leakage current flows in the direction of the illustrated arrow of FIG. 17. Resultingly, there may occur a program disturbance by which the second cell transistor TR2 is undesirably programmed.

In an attempt to avoid the undesirable programming of an adjacent non-selected cell transistor, the device isolation layer 102 may be formed thicker than a predetermined thickness. However, the thickness of the device isolation layer 102 is restricted by the height of the fin 101. Another approach may be to isolate the fin from adjacent fins by forming the fin 101 on a silicon-on-insulator (SOI) substrate. However, SOI substrate processes can be very expensive and a back bias may not be applied thereto.

SUMMARY OF EMBODIMENTS OF THE INVENTION

Some embodiments of the present invention provide a fin field effect transistor (FET) and related nonvolatile memory devices which may be capable of reducing the occurrence of or preventing program disturbances.

Some other embodiments of the present invention provide a method of forming a nonvolatile memory device using a FinFET that may be capable of reducing the occurrence of or preventing program disturbances.

In accordance with some embodiments, the FinFETs include an insulating layer between their fins and a substrate to improve the isolation of the fins from one another.

In some embodiments, a FinFET includes a fin that is on a substrate and extends away from the substrate. A device isolation layer is disposed on the substrate on both sides of the fin. An insulating layer is between the fin and the substrate. The insulating layer is directly connected to the device isolation layer and has a different thickness than the device isolation layer. A gate electrode crosses over the fin. A gate insulating layer is between the gate electrode and the fin. Source and drain regions are on the fins and on opposite sides of the gate electrode.

The insulating layer may allow two adjacent fins to be sufficient isolated from one another so that they may operate independently, and may reduce the occurrence of or preventing program disturbances.

In some further embodiments, the FinFET further includes a charge storage layer between the gate insulating layer and the gate electrode, and a blocking insulating layer between the charge storage layer and the gate electrode. A central portion of the insulating layer between the fin and the substrate may be thinner than outer portions of the insulating layer adjacent to edges of the fin. The fin may include an upper fin and a lower fin aligned with one another on opposite sides of, and separated by, the insulating layer. The device isolation layer may cover sidewalls of the lower fin. The upper fin may have the same width as the lower fin. Alternatively, the upper fin may be narrower than the lower fin.

According to some other embodiments of the present invention, a nonvolatile memory device includes a plurality of fins on a semiconductor substrate and which extend away from the substrate and are arranged as a pattern of lines. A device isolation layer is disposed on the semiconductor substrate on both sides of each of the fins. A tunnel insulating layer is on the fins. A charge storage layer is on the tunnel insulating layer. A blocking insulating layer is on the charge storage layer. A plurality of word lines are on the blocking insulating layer and cross over the fins. A pair of impurity regions are on each of the fins and on opposite sides of each of the word lines. An insulating layer is between the fin and the substrate. The insulating layer is directly connected to the device isolation layer and has a different thickness than the device isolation layer.

In some further embodiments, a central portion of the insulating layer between each of the fins and the substrate may be thinner than outer portions of the insulating layer adjacent to edges of the fins. Each of the fins may include an upper fin and a lower fin aligned with one another on opposite sides of, and separated by, the insulating layer. The device isolation layer may cover sidewalls of the lower fin. The upper fin may have the same width as the lower fin. Alternatively, the upper fin may be narrower than the lower fin.

In some further embodiments, a fin connection part may extend from the semiconductor substrate and may have the same height as the fin. The device isolation layer adjacent to the fin connection part may have a top surface that is equal in height or higher than a top surface of the fin connection part. The insulating layer may not be disposed in the fin connection part. The fin connection part may laterally extend to directly contact adjacent fins. A contact or an interconnection may be on the fin connection part and configured to conduct a voltage thereto In some further embodiments, the nonvolatile memory device further includes ground select lines and string select lines crossing over the fins and on opposite sides of the plurality of word lines. The ground select line, the string select line, and the word lines form one string, and the fin connection part is between an adjacent pair of the ground select lines.

Some other embodiments of the present invention are directed to methods of forming a FinFET in which an oxidation process is performed to form the insulating layer under the fin to isolate the fin from adjacent fins. The methods include forming a mask pattern that defines a fin region on a semiconductor substrate. The semiconductor substrate is etched using the mask pattern as an etch mask to form a fin that protrudes from the semiconductor substrate and a trench on both sides of the fin. A device isolation layer is formed in the trench on both sides of the fin. An insulating layer is formed in the fin. The insulating layer is directly connected to the device isolation layer and has a different thickness than the device isolation layer. A gate insulating layer is formed on the fin. A gate electrode is formed that crosses over the fin. The gate insulating layer is between the gate electrode and the fin.

The insulating layer and the device isolation layer may be easily formed without the use of a SOI substrate, which may reduce the cost of the fabrication process. In addition, because the respective fins are isolated by the insulating layer, it may be more easy to electrically isolate the devices when the thickness of the device isolation layer is very small. The FinFET may thereby be used in highly integrated semiconductor devices, such as those having device features of 50 nm or less.

In some further embodiments, a charge storage layer is formed on the gate insulating layer. A blocking insulating layer is formed on the charge storage layer, and the gate electrode is formed directly on the blocking insulating layer.

In some further embodiments, the device isolation layer and the insulating layer may be formed by: forming a spacer covering sidewalls of the fin; performing an oxidation process to form the device isolation layer in the trench and, simultaneously, to form the insulating layer under the fin; and removing the spacer. A central portion of the insulating layer between the fin and the substrate may be thinner than outer portions of the insulating layer adjacent to edges of the fin.

In some further embodiments, the device isolation layer and the insulating layer may be formed by: filling the trench with the device isolation layer; etching back the device isolation layer to partially expose sidewalls of the fin and to leave a portion of the device isolation layer in a lower portion of the trench; forming a spacer covering the exposed sidewalls of the fin; forming the insulating layer in the fin by performing a first oxidation process to separate the fin into an upper fin and a lower fin, wherein the insulating layer is directly connected to the device isolation layer; and removing the spacer to expose the sidewall of the fin. A central portion of the insulating layer between the fin and the substrate may be thinner than outer portions of the insulating layer adjacent to edges of the fin. The upper fin may have the same width as the lower fin. The mask pattern may be removed at the same time that the spacer is removed, and the method may further include, after removing the spacer: forming an oxide layer on a top surface and sidewalls of the fin by performing a second oxidation process that reduces the width of the fin; and removing the oxide layer.

In some further embodiments, the device isolation layer and the insulating layer may be formed by: filling the trench with the device isolation layer; etching back the device isolation layer to partially expose sidewalls of the fin and to leave a portion of the device isolation layer in a lower portion of the trench; forming an oxide layer on the sidewalls of the fin by performing a first oxidation process that reduces the width of the fin; forming a spacer covering the exposed sidewall of the fin; performing a second oxidation process to form the insulating layer in the fin; and removing the spacer and the oxide layer. A central portion of the insulating layer between the fin and the substrate may be thinner than outer portions of the insulating layer adjacent to edges of the fin, and the upper fin may be narrower than the lower fin.

According to some other embodiments of the present invention, a method of forming a nonvolatile memory device includes forming a first mask pattern that exposes portions of a semiconductor substrate. The semiconductor substrate is etched using the first mask pattern as an etch mask to form a plurality of fins that extend away from the substrate and are arranged as a pattern of lines, and to form a trench on both sides of each of the fins. A device isolation layer is formed in the trenches. An insulating layer is formed in the fin. The insulating layer is directly connected to the device isolation layers and has a different thickness than the device isolation layers. A tunnel insulating layer is formed on the fins. A charge storage layer is formed on the tunnel insulating layer. A blocking insulating layer is formed on the charge storage layer. A gate conductive layer is formed on the blocking insulating layer. The gate conductive layer is patterned to form a plurality of word lines that cross over the fins.

In some further embodiments, a central portion of the insulating layer between the fin and the substrate is thinner than outer portions of the insulating layer adjacent to edges of the fins, and the upper fin has the same width as the lower fin.

The method may further include, after removing the first mask pattern, the second mask pattern, and the spacer: forming an oxide layer on a top surface and sidewalls of the fins by performing a second oxidation process that reduces the width of the fins; and removing the oxide layer.

In some further embodiments, the device isolation layer and the insulating layer may be formed by: filling the trench with the device isolation layer; forming a second mask pattern covering the fin connection part and a portion of the device isolation layer adjacent to the fin connection part; etching the device isolation layer, using the first and second mask patterns as an etch mask, to form a sidewall device isolation layer covering sidewalls of the fin connection part and, simultaneously, to partially expose sidewalls of the fins while a portion of the device isolation layer remains in a lower portion of the trench; removing the second mask pattern; performing a first oxidation process to form an oxide layer on the exposed sidewalls of the fins and, simultaneously, to reduce the width of the fins; forming a spacer covering the first mask pattern, sidewalls of the device isolation layer, and sidewalls of the oxide layer; forming an insulating layer in the fins by performing a second oxidation process to separate each of the fins into an upper fin and a lower fin; removing the first mask pattern and the spacer; and removing the oxide layer. A central portion of the insulating layer between the fin and the substrate may be thinner than outer portions of the insulating layer adjacent to edges of the fins, and the upper fin is narrower than the lower fin.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 15 and 16 are plane views of NAND type nonvolatile memory devices according to some other embodiments of the present invention.

DETAILED DESCRIPTION OF EMBODIMENTS OF THE INVENTION

Figure 1:
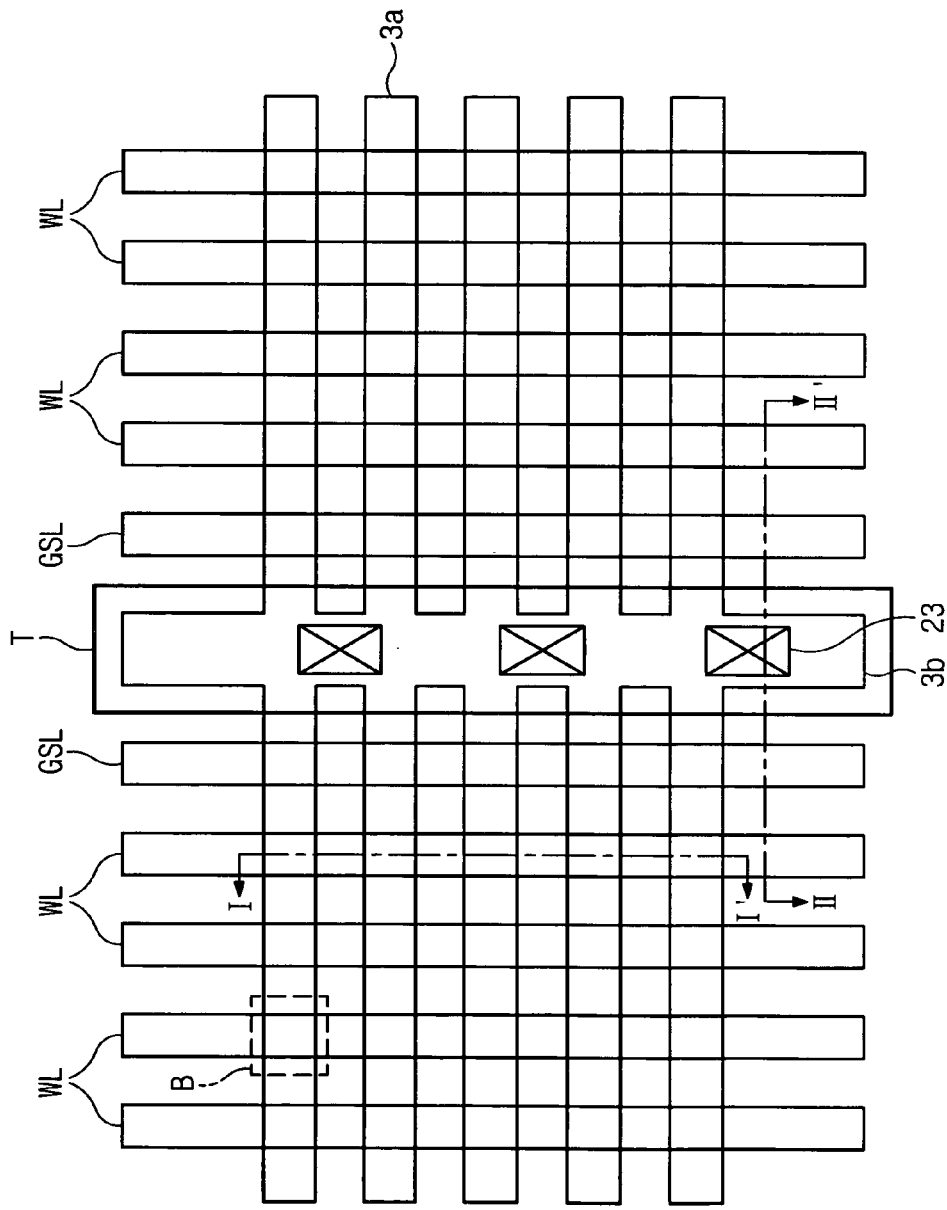
FIG. 1 is a plane view of a NAND type nonvolatile memory device according to an embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" and "/" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
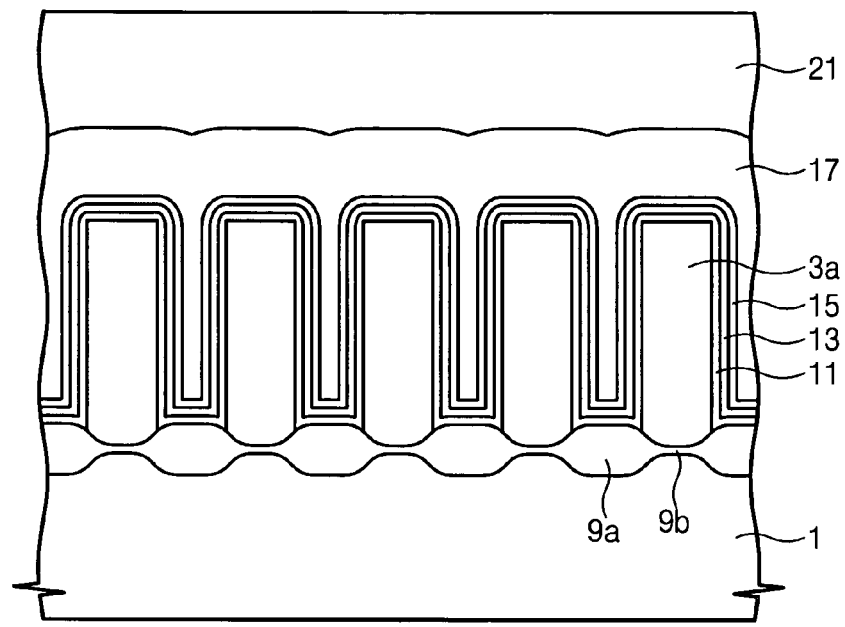
FIG. 2A is a cross-sectional view taken along the line I-I' of FIG. 1 according to an embodiment of the present invention.
Figure 2B:
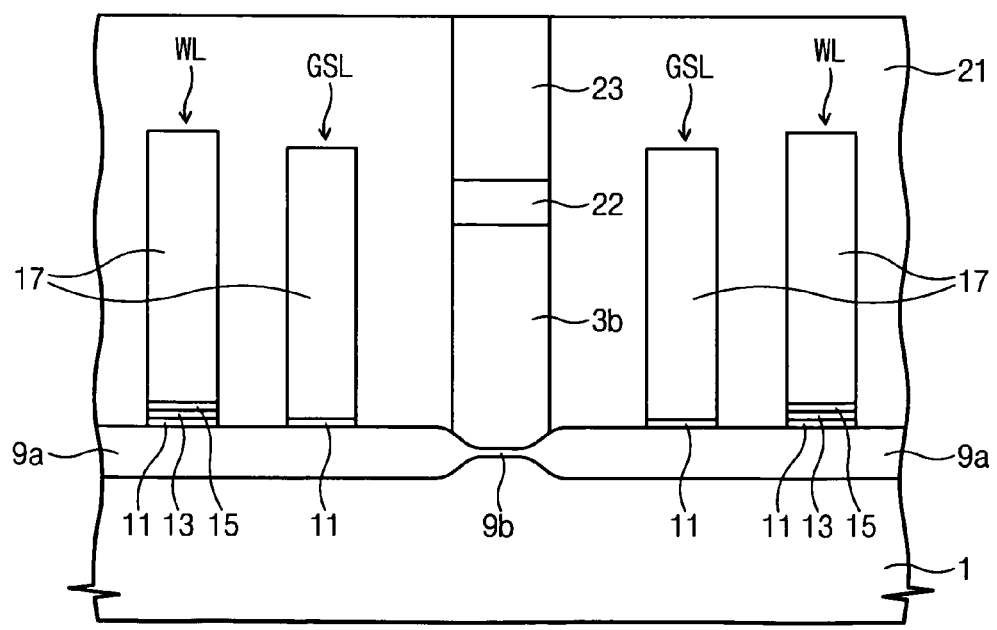
FIG. 2B is a cross-sectional view taken along the line II-II' of FIG. 1 according to an embodiment of the present invention.
Figure 2C:
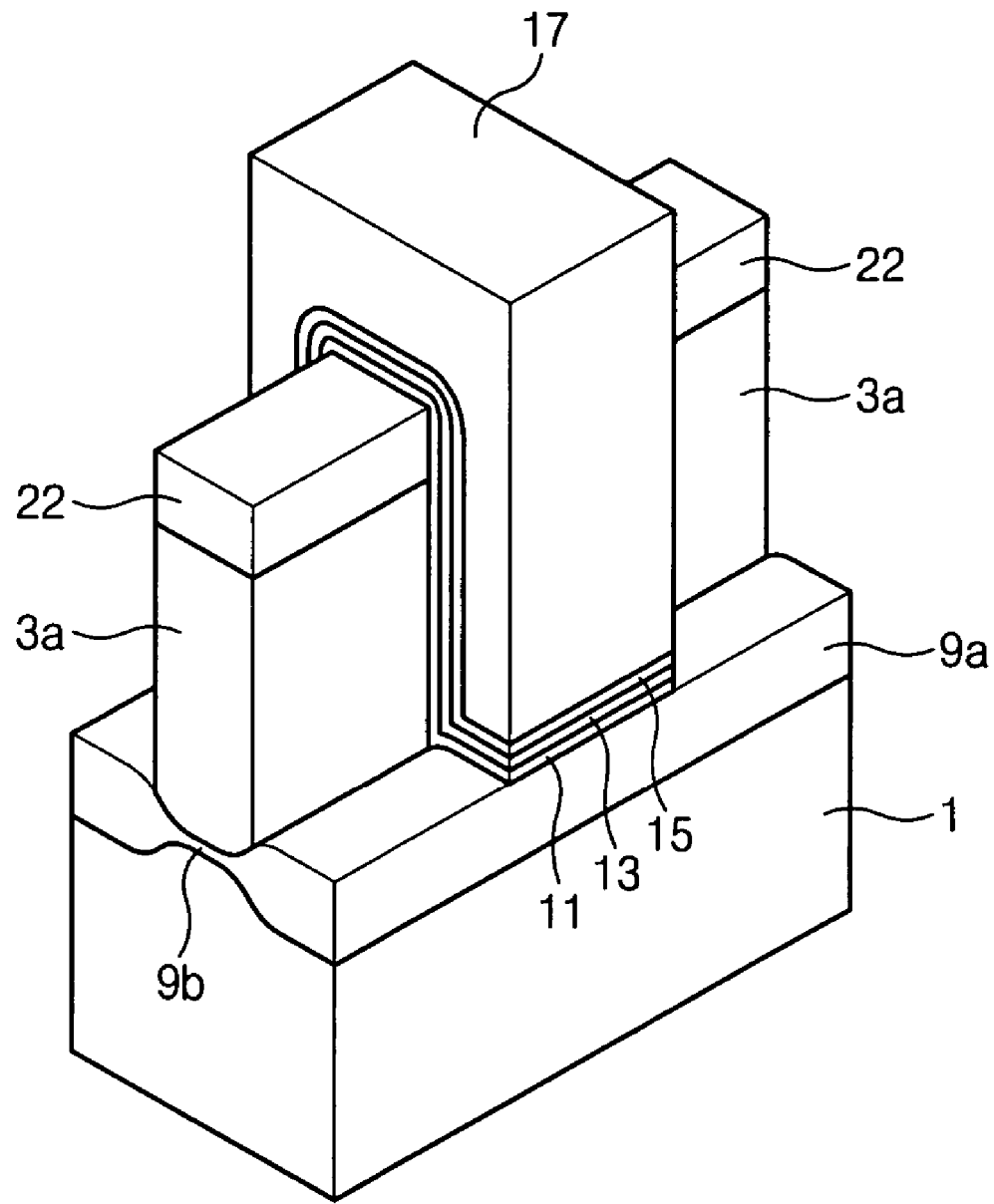
FIG. 2C is an enlarged partial perspective view of the portion 'B' of FIG. 1 according to an embodiment of the present invention.

FIG. 1 is a plane view of a NAND type nonvolatile memory device according to an embodiment of the present invention. FIGS. 2A to 2C illustrate some embodiments of the present invention. FIG. 2A is a cross-sectional view taken along the line I-I' of FIG. 1, and FIG. 2B is a cross-sectional view taken along the line II-II' of FIG. 1. FIG. 2C is an enlarged partial perspective view of the portion 'B' of FIG. 1.

Referring to FIGS. 1, 2A, 2B and 2C, a plurality of fins 3a arranged as lines parallel with one another extend upwardly away from a semiconductor substrate 1. In the central region of the plurality of fins 3a, a fin connection part 3b to which a voltage is directly applied is disposed. The fin connection part 3b crosses over the plurality of fins 3a and is connected to the fins 3a. The fin 3a can have the same height as the fin connection part 3b and collectively form an active region. A device isolation layer 9a is disposed on the semiconductor substrate 1 on both sides of each of the fin 3a and the fin connection part 3b. An insulating layer 9b is disposed under the fin 3a and it is connected to the device isolation layers 9a on both sides thereof. The insulating layer 9b isolates the respective fins 3a. The insulating layer 9b may be disposed under the fin connection part 3b. The insulating layer 9b is thinner than the device isolation layer 9a. The insulating layer 9b at the edges of the fin 3a is thicker than the insulating layer 9b at the center of the fin 3a. The device isolation layer 9a and the insulating layer 9b can be formed of the same material, e.g., preferably, a silicon oxide layer.

A plurality of word lines WL are arranged such that they cross over the fins 3a. On both sides of the word lines WL included in one string, a ground select line GSL and a string select line (not shown) are arranged. Herein, the string is symmetrically repeated. The word line WL is provided with a tunnel insulating layer 11 (also referred to as a gate insulating layer), a charge storage layer 13, a blocking insulating layer 15, and a gate conductive layer 17 (also referred to as a gate electrode) which are stacked in sequence. The ground select line GSL is provided with the tunnel insulating layer 11 and the gate conductive layer 17 stacked in sequence. It is preferable that the ground select line GSL and the string select line (not shown) do not have the charge storage layer 13. The fin connection part 3b is disposed between the ground select line GSL and an adjacent ground select line or/and between a string select line and an adjacent string select line. An impurity region 22 is disposed on the fin 3a and the fin connection part 3b on both sides of the respective lines WL and GSL, and which forms source and drain regions on the fins on both sides of the gate conductive layer 17. Each line WL and GSL, the fins 3a and the fin connection part 3b are embedded with an interlayer insulating layer 21. A common source contact 23 penetrates through the interlayer insluting layer 21 to be connected with the upper portion of the fin connection part 3b.

Since the insulating layer 9b is disposed under the fins 3a in the nonvolatile memory device so that each fin 3a is isolated from adjacent fins 3a, it is possible to substantially inhibit or prevent a leakage current from flowing under the device isolation layer. Thus, erroneous programming of a non-selected adjacent transistor, referred to as a program disturbance, may be prevented during a device programming or other operation.

Figure 3A:
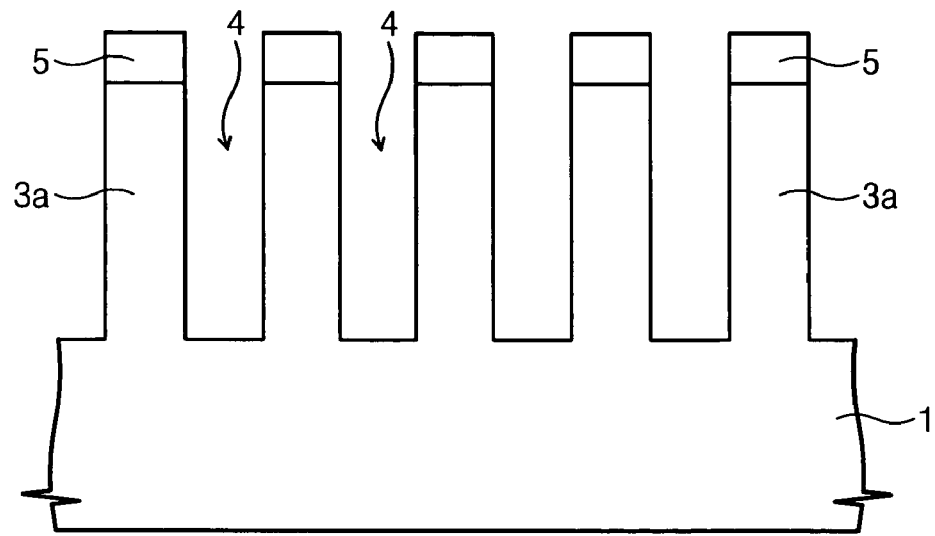
FIGS. 3A, 4A and 5A are cross-sectional views illustrating methods of forming the nonvolatile memory device of FIG. 2A according to some embodiments of the present invention.
Figure 3B:
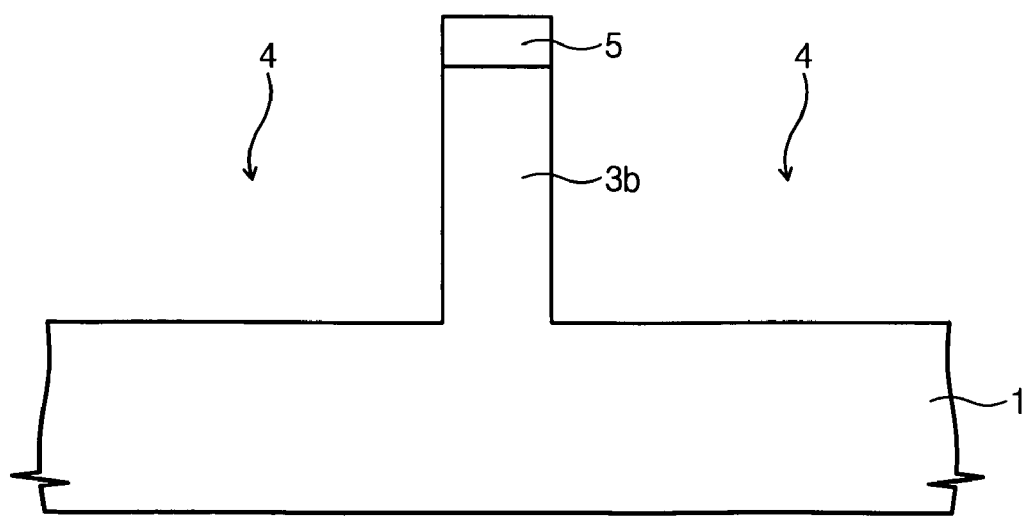
FIGS. 3B, 4B and 5B are cross-sectional views illustrating methods of forming the nonvolatile memory device of FIG. 2B according to some embodiments of the present invention.
Figure 3C:
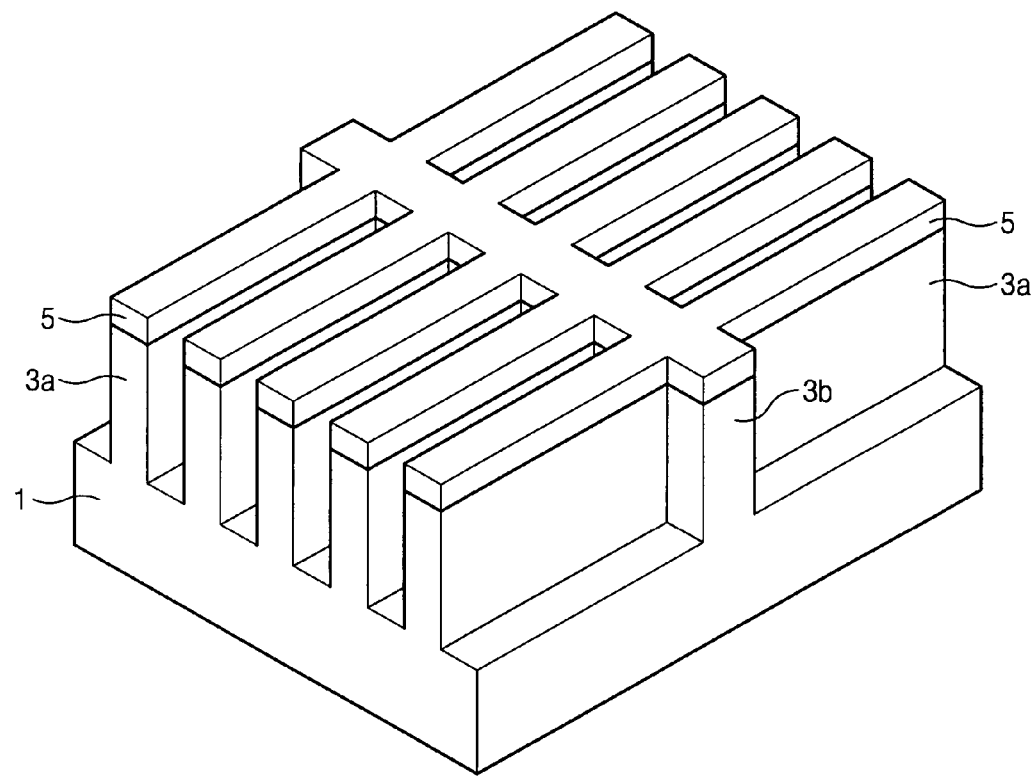
FIG. 3C is a perspective view illustrating methods of forming a fin and a fin connection part of the nonvolatile memory device of FIG. 1 according to some embodiments of the present invention.
Figure 4A:
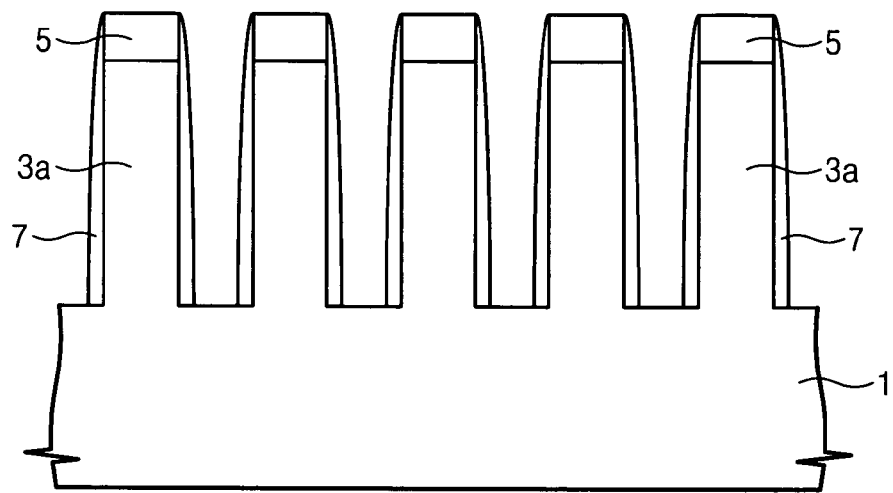
Figure 4B:
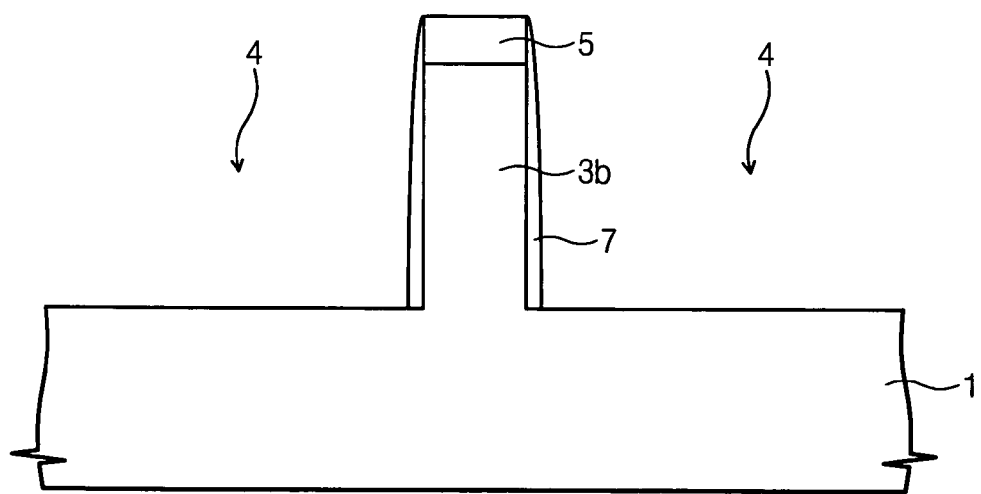
Figure 5A:
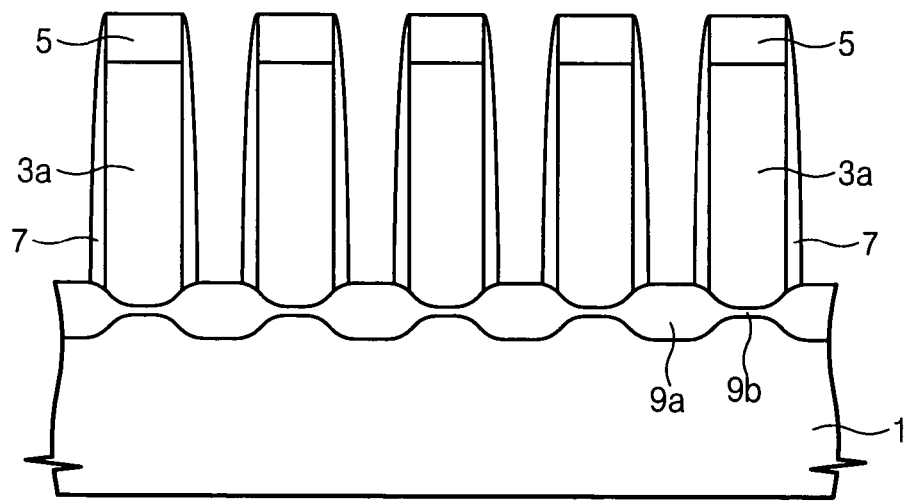
Figure 5B:
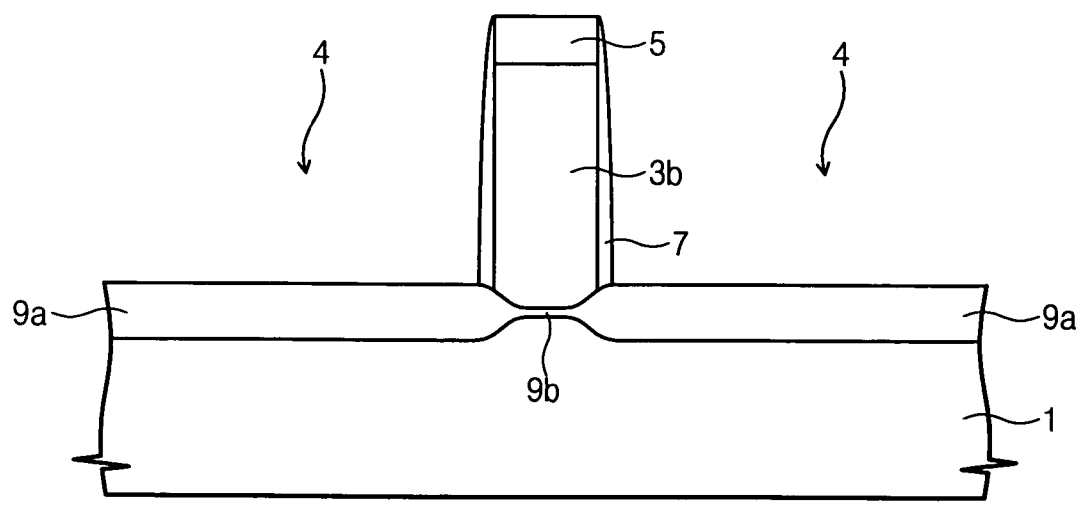

A method of forming the nonvolatile memory device of FIGS. 2A to 2C will now be explained with reference to FIGS. 3A, 3B, 3C, 4A, 4B, 5A and 5B. FIGS. 3A, 4A and 5A are cross-sectional views illustrating methods of forming the nonvolatile memory device of FIG. 2A. FIGS. 3B, 4B and 5B are cross-sectional views illustrating methods of forming the nonvolatile memory device of FIG. 2B. FIG. 3C is a perspective view illustrating a method of forming the fin and the fin connection part of the nonvolatile memory device of FIG. 1.

Referring to FIGS. 3A to 3C, a first mask pattern 5 is formed on the semiconductor substrate 1, wherein the first mask pattern 5 defines the fin 3a and the fin connection part 3b. The first mask pattern 5 may be formed of a material having an etch selectivity with respect to the semiconductor substrate 1. For example, the first mask pattern 5 may be formed of a single layer having a silicon nitride layer or a bi-layer having a silicon oxide layer and a silicon nitride layer. The semiconductor substrate 1 is etched using the first mask pattern 5 as an etch mask, to thereby form a trench 4. As a result, a plurality of fins 3a arranged as parallel lines are formed along with the fin connection part 3b which connects the fins 3a.

Referring to FIGS. 4A and 4B, a spacer layer (not shown) is formed on the entire surface of the semiconductor substrate 1, and is anisotropically etched so as to form a spacer 7 which covers the first mask pattern 5, the fins 3a and the fin connection part 3b. It may be preferable for the spacer layer to be formed of a layer which can prevent the penetration of oxygen, e.g., a silicon nitride layer.

Referring to FIGS. 5A and 5B, a first oxidation process is performed over the semiconductor substrate 1 in oxygen ambient. Therefore, the semiconductor substrate 1 on both sides of each of the fins 3a and fin connection part 3b is oxidized so that the thick device isolation layer 9a is formed and, simultaneously, the insulating layer 9b is formed under each of the fins 3a and the fin connection part 3b because oxygen penetrates under the spacer 7 nearby the substrate 1. The device isolation layer 9a and the insulating layer 9b are formed of a silicon oxide layer, and they are formed in the shape of a bird's beak because the layers 9a and 9b are formed through a local oxidation of silicon (LOCOS) process. During the first oxidation process, the upper portion and sidewalls of each of the fin 3a and the fin connection part 3b are protected by the first mask pattern 5 and the spacer 7, respectively, so that these regions are not oxidized.

Through subsequent operations, referring back to FIGS. 2A to 2C, the first mask pattern 5 and the spacer 5 are removed. Thereafter, the tunnel insulating layer 11, the charge storage layer 13, and the blocking insulting layer 15 are formed in sequence. For example, the tunnel insulating layer 11 and the blocking insulating layer 15 may be formed of a silicon oxide layer. The charge storage layer 13 may be formed of a dielectric layer of which the dielectric constant is higher than that of the silicon oxide layer. For instance, the charge storage layer 13 may be formed from at least one layer selected from the group consisting of a silicon layer, a silicon nitride layer, an aluminum oxide layer, a silicon germanium dot, a silicon dot, and a metal dot.

In the region where the ground select line GSL and the string select line will be formed, the blocking insulating layer 15 and the charge storage layer 13 are removed. Afterwards, a gate conductive layer 17 is entirely formed and patterned, to thereby form the respective lines. Thereafter, an ion implantation is performed so as to form the impurity region 22 on the fins 3a and the fin connection part 3b on both sides of the respective lines. Then, the interlayer insulating layer 21 is formed and patterned so as to form a contact hole exposing the fin connection part 3b. Subsequently, the contact hole is filled with a conductive material to thereby form the common source contact 23. Although it is not shown in the drawings, an etch stop layer may be conformally formed before the formation of the interlayer insulating layer 21. Through the aforementioned method, the floating trap type nonvolatile memory device illustrated in FIGS. 2A to 2C may be formed.

According to some methods of forming the floating trap type nonvolatile memory device as described above, since the device isolation layer 9a and the insulating layer 9b may be more easily formed and without necessitating the use of a SOI substrate, the associated processes may be simplified and may be carried out more economically.

Figure 6A:
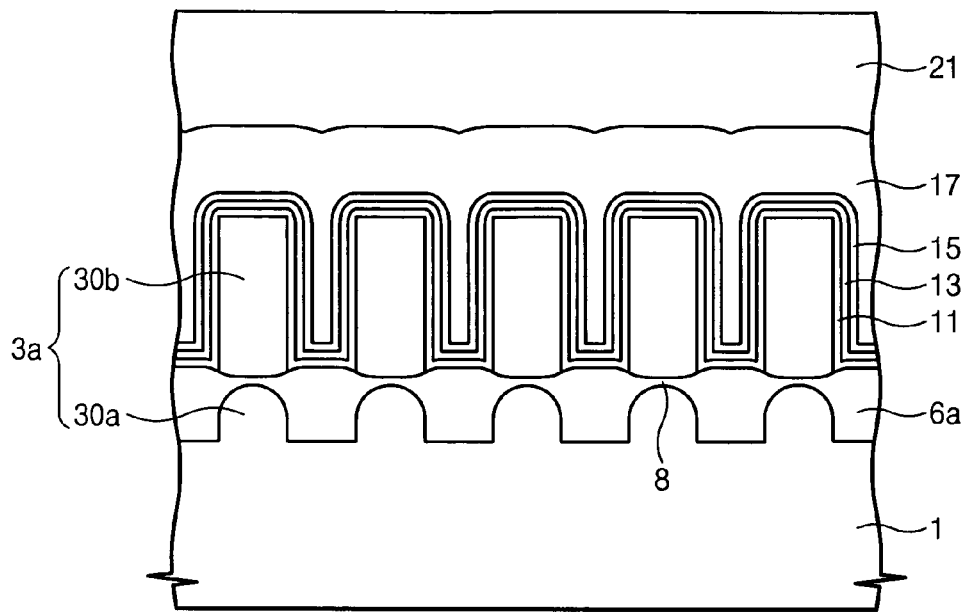
FIG. 6A is a cross-sectional view taken along the line I-I' of FIG. 1 according to another embodiment of the present invention.
Figure 6B:
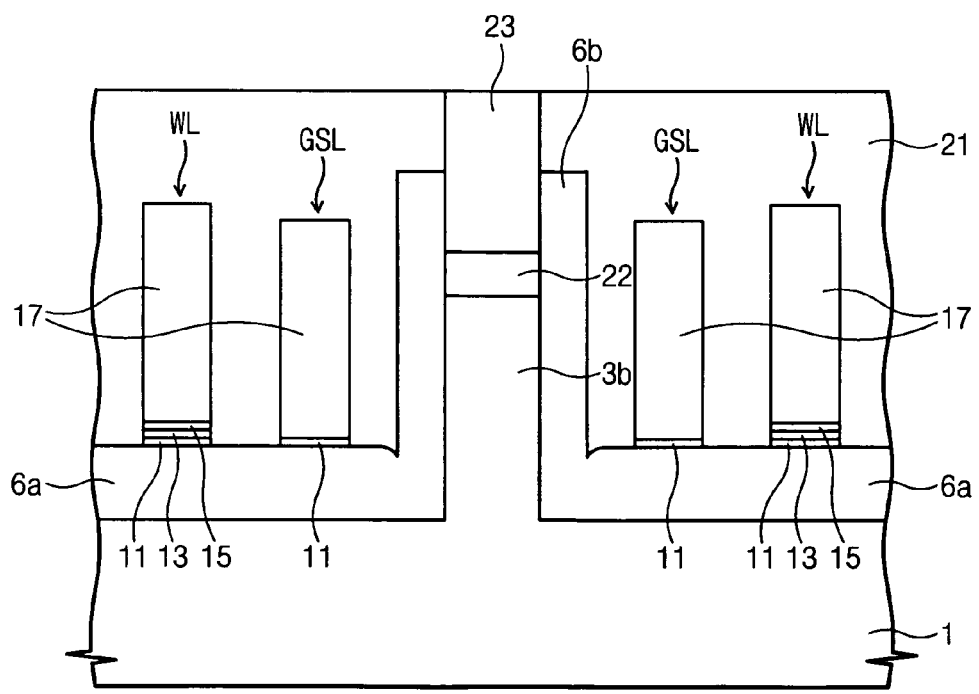
FIG. 6B is a cross-sectional view taken along the line II-II' of FIG. 1 according to another embodiment of the present invention.

Another nonvolatile memory device will now be explained with reference to FIGS. 6A and 6B. Although this nonvolatile memory device has the same layout scheme illustrated in FIG. 1, it has a different cross-sectional structure than those of FIGS. 2A and 2B. FIGS. 6A and 6B are cross-sectional views of the nonvolatile memory device according to another embodiment of the present invention. Herein, FIG. 6A is a cross-sectional view taken along the line I-I' of FIG. 1 and FIG. 6B is a cross-sectional view taken along the line II-II' of FIG. 1.

Referring to FIGS. 1, 6A and 6B, an insulating layer 8 is connected to an upper portion of a device isolation layer 6a. The insulating layer 8 is formed inside the fin 3a so that the fin 3a is separated into an upper fin 30b and a lower fin 30a. Herein, the upper fin 30b can have the same width as the lower fin 30a. In this embodiment, the insulating layer 8 is not disposed under a fin connection part 3b. In this case, it is easy for a common source contact to be electrically connected to a well region (not shown) of a semiconductor substrate 1 through the fin connection part 3b. Sidewalls of the fin connection part 3b are covered with a sidewall device isolation layer 6b, wherein the sidewall device isolation layer 6b extends further away from the substrate 1 to provide a top surface which is higher (further away from the substrate 1) than the fin connection part 3b. The sidewall device isolation layer 6b may play a role in protecting the sidewall of the fin connection part 3b from being damaged during the etching process. Therefore, it is possible to enhance a junction characteristic for the ground connection of the well region. The sidewall device isolation layer 6b is positioned within a T zone of FIG. 1, which is an area adjacent to the fin connection part 3b.

Figure 7A:
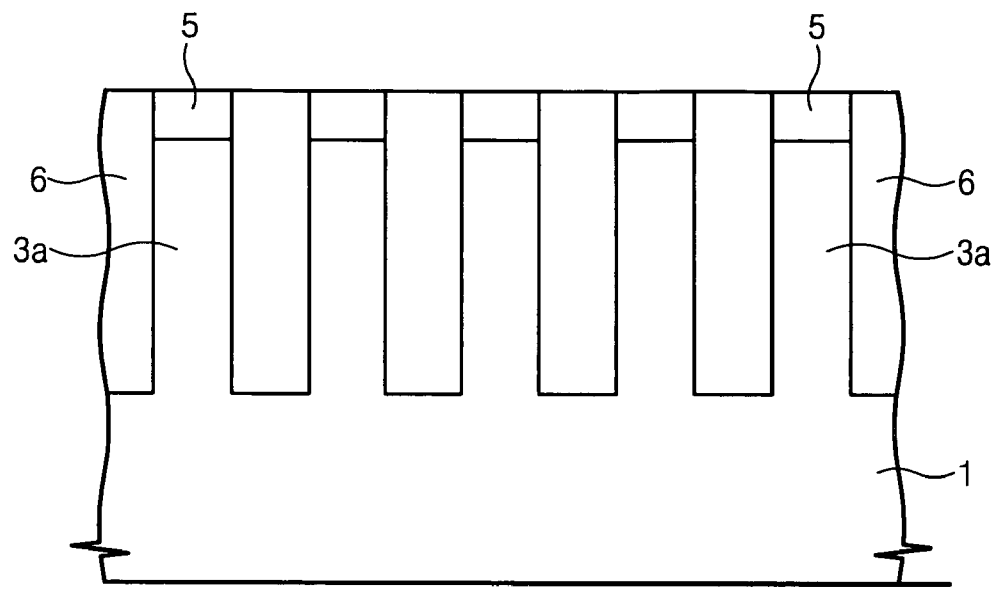
FIGS. 7A, 8A and 9A are cross-sectional views illustrating methods of forming the nonvolatile memory device of FIG. 6A according to some embodiments of the present invention.
Figure 7B:
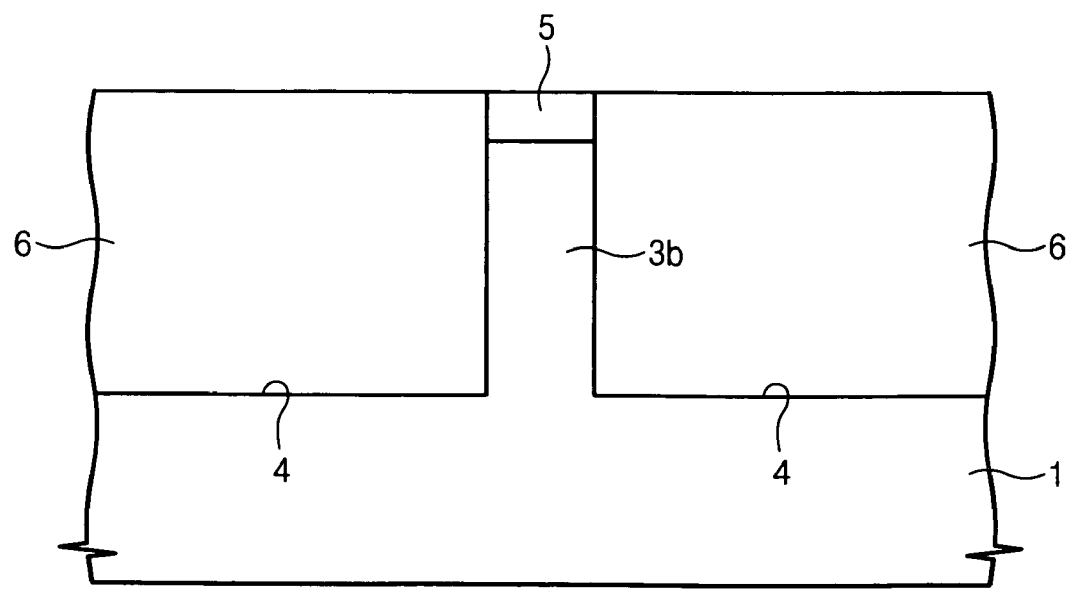
FIGS. 7B, 8B and 9B are cross-sectional views illustrating methods of forming the nonvolatile memory device of FIG. 6B according to some embodiments of the present invention.
Figure 8A:
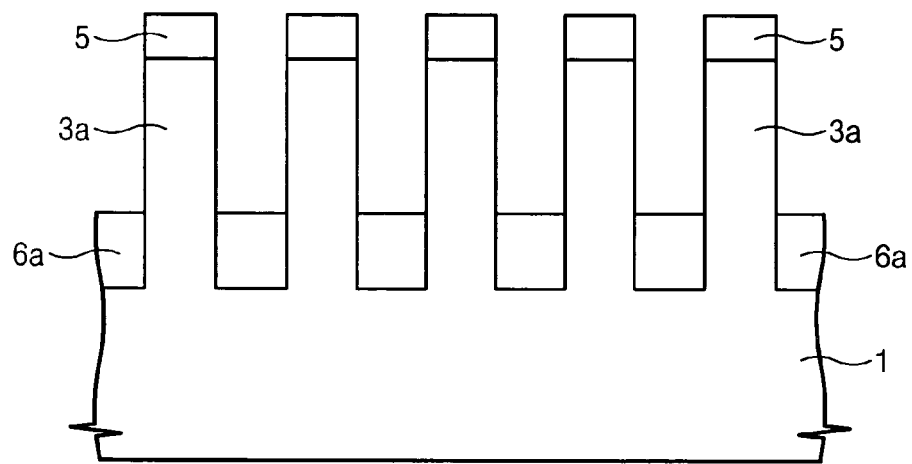
Figure 8B:
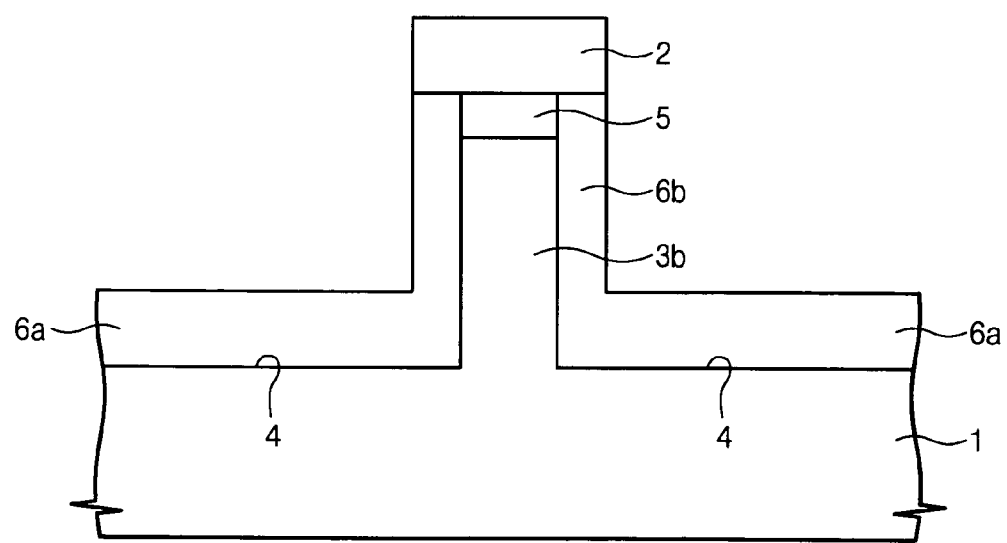
Figure 9A:
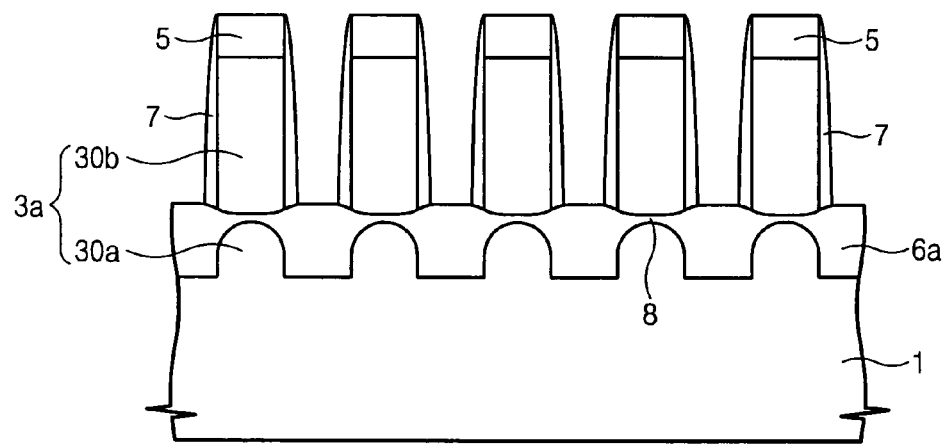
Figure 9B:
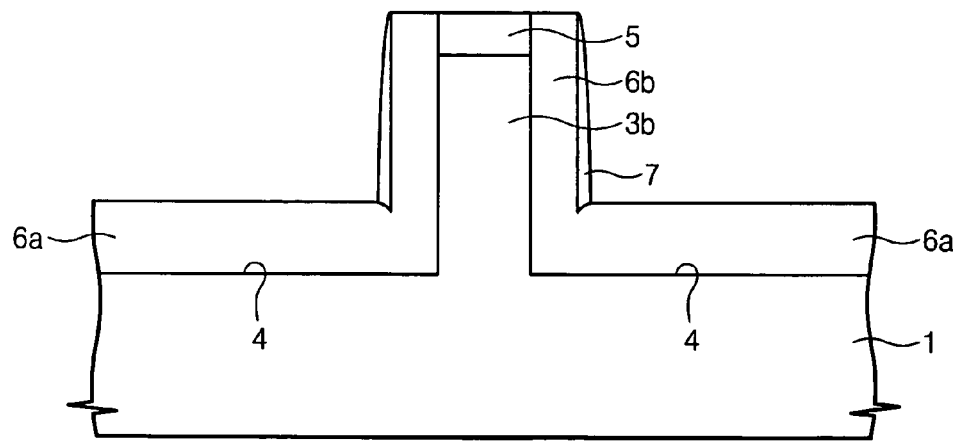

Methods of forming the nonvolatile memory device are illustrated in FIGS. 6A and 6B and are explained with reference to FIGS. 7A, 7B, 8A, 8B, 9A and 9B. FIGS. 7A, 8A and 9A are cross-sectional views illustrating methods of forming the nonvolatile memory device of FIG. 6A. FIGS. 7B, 8B and 9B are cross-sectional views illustrating methods of forming the nonvolatile memory device of FIG. 6B.

After preparing the semiconductor substrate 1 having the cross-sectional structure as illustrated in FIGS. 3A and 3B, the device isolation layer 6 is formed to fill the trench 4. A planarization process is performed over the device isolation layer 6 using the first mask pattern 5 as a planarization stop layer, to thereby form the device isolation layer 6 in the trench 4. The device isolation layer 6 may be formed from at least one material selected from the group consisting of materials contained in the tunnel insulating layer 11, the charge storage layer 13, and the blocking insulating layer 15. For example, the device isolation layer 6 may be formed of a thermal oxide layer, a silicon nitride layer and/or a chemical vapor deposition (CVD) oxide layer.

Subsequently, referring to FIGS. 1, 8A and 8B, a second mask pattern 2 is formed to cover the fin connection part 3b and the T zone adjacent to the fin connection part 3b. Afterwards, an etch back process is performed over the device isolation layer 6 using the first and second mask patterns 5 and 2 as an etch mask so that the device isolation layer 6a with a predetermined thickness remains under the trench 4 and, simultaneously, the sidewall device isolation layer 6b is be formed to cover the sidewall of the fin connection part 3b.

Referring to FIGS. 9A and 9B, a spacer layer (not shown) is formed on the entire surface of the semiconductor substrate 1 and anisotropically etched, to thereby form the spacer 7. Thereafter, a first oxidation process is performed in an oxygen ambient such that the oxygen penetrates under the spacer 7 nearby by the substrate 1 so that the insulating layer 8 is formed under the fin 3a. By means of the insulating layer 8, the fin 3a is separated into the upper fin 30b and the lower fin 30a. Because the sidewall of the fin connection part 3b is covered with the thick sidewall device isolation layer 6b and the spacer 7, and thick device isolation layer 6a is disposed on the substrate 1 on both sides of the fin connection part 3b, it is difficult for the oxygen to penetrate therethrough so that the insulating layer 8 is not formed under the fin connection part 3b.

The mask patterns 5 and 2 and the spacer 7 are then removed. The second mask pattern 2 may be removed before forming the spacer 7. Thereafter, there are formed a word line WL, a ground select line GSL, a string select line (not shown), an impurity region 22, an interlayer insulating layer 21, and a common source contact 23, through the same operations as illustrated in the previous embodiments, whereby the nonvolatile memory device is completed. In the nonvolatile memory device, according to another embodiment, the device isolation layer 6a is formed through deposition, etch-back, or the like so that it is easy to control the thickness of the device isolation layer 6a.

Figure 10A:
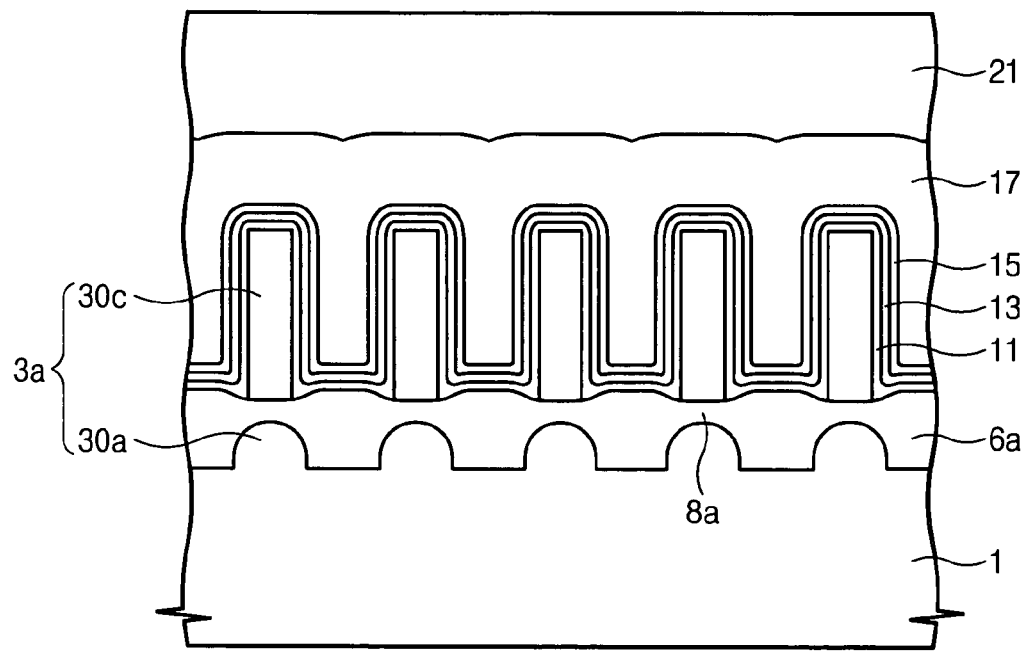
FIG. 10A is a cross-sectional view taken along the line I-I' of FIG. 1 according to another embodiment of the present invention.
Figure 10B:
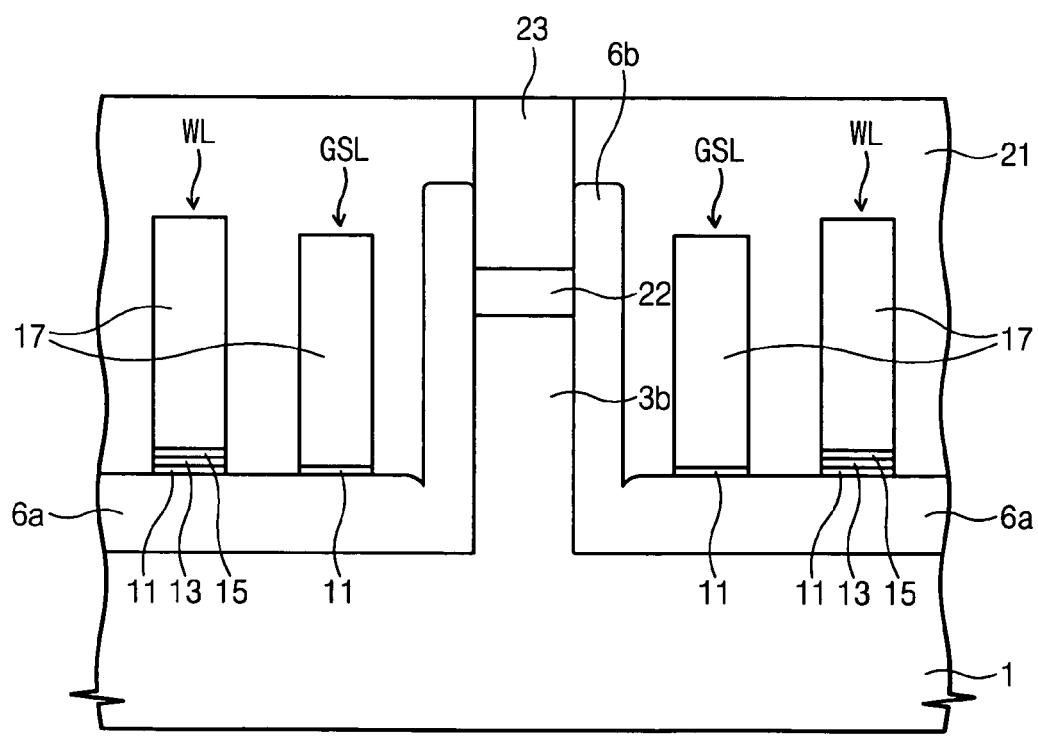
FIG. 10B is a cross-sectional view taken along the line II-II' of FIG. 1 according to another embodiment of the present invention.

A nonvolatile memory device according to another embodiment of the present invention will now be explained. The nonvolatile memory device has the same layout scheme of FIG. 1 but its cross-sectional structure is different from those of FIGS. 2A and 2B, or FIGS. 6A and 6B. FIGS. 10A and 10B are cross-sectional views of the nonvolatile memory device according to another embodiment of the present invention. FIG. 10A is a cross-sectional view taken along the line I-I' of FIG. 1 and FIG. 10B is a cross-sectional view taken along the line II-II' of FIG. 1.

Referring to FIGS. 1, 10A and 10B, a fin 3a is separated into an upper fin 30c and a lower fin 30a by an insulating layer 8a. The nonvolatile memory device of FIGS. 10A and 10B is identical in constitution to the memory device of FIGS. 6A and 6B except that the upper fin 30c has a narrower width than the lower fin 30a. Since the memory device according to this embodiment has the narrower upper fin 30c in comparing with the nonvolatile memory device in FIGS. 6A and 6B, it may be possible to increase the controllability of the gate with respect to the channel.

Figure 11A:
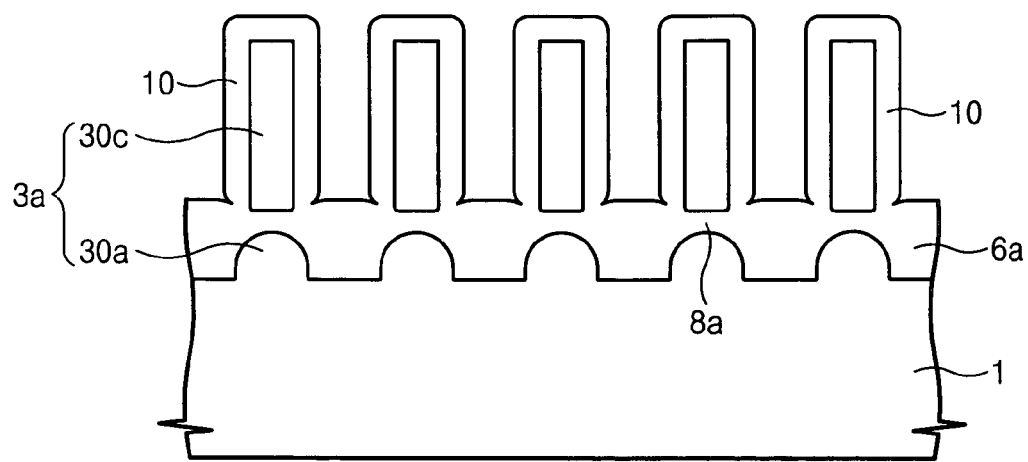
FIG. 11A is a cross-sectional view illustrating methods of forming the nonvolatile memory device of FIG. 10A according to some embodiments of the present invention.
Figure 11B:
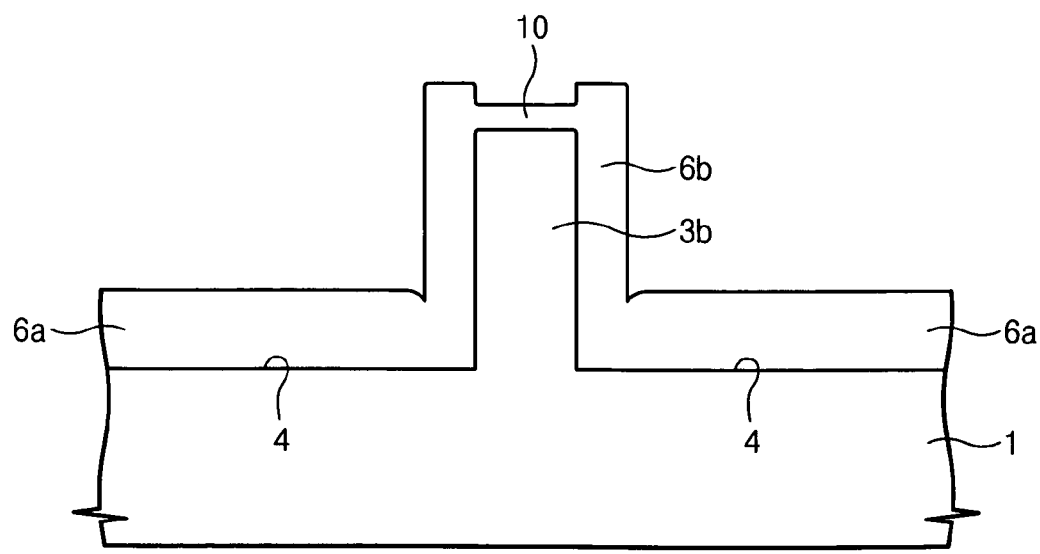
FIG. 11B is a cross-sectional view illustrating methods of forming the nonvolatile memory device of FIG. 10B according to some embodiments of the present invention.

Methods of forming the nonvolatile memory device of FIGS. 10A and 10B will be explained with reference to FIGS. 11A and 11B. FIG. 11A is a cross-sectional view illustrating methods of forming the nonvolatile memory device of FIG. 10A according to some embodiments. FIG. 11B is a cross-sectional view illustrating methods of forming the nonvolatile memory device of FIG. 10B according to some embodiments.

Referring to FIGS. 11A and 11B, the semiconductor substrate 1 is prepared to provide a cross-sectional structure in which that the first mask pattern 5 and the spacer 7 are not included, as illustrated by the cross-sectional views of FIGS. 9A and 9B. That is, the sidewall and upper portion of the upper fin 30b and the upper portion of the fin connection part 3b are exposed unlike in FIGS. 9A and 9B. Thereafter, a second oxidation process is performed in oxygen ambient so as to form an oxide layer 10 on the sidewall and upper portion of the upper fin 30b and the upper portion of the fin connection part 3b. Accordingly, the width and height of the upper fin 30b are reduced. In this manner, it may be possible to form the width of the fin 3a to be much less than a critical dimension of the associated photolithography.

Thereafter, the oxide layer 10 is removed by wet etching. As illustrated in these embodiments, a word line WL, a ground select line GSL, a string select line (not shown), an impurity region 22, an interlayer insulating layer 21, and a common source contact 23 are formed to provide the nonvolatile memory device of FIGS. 10A and 10B.

Figure 12A:
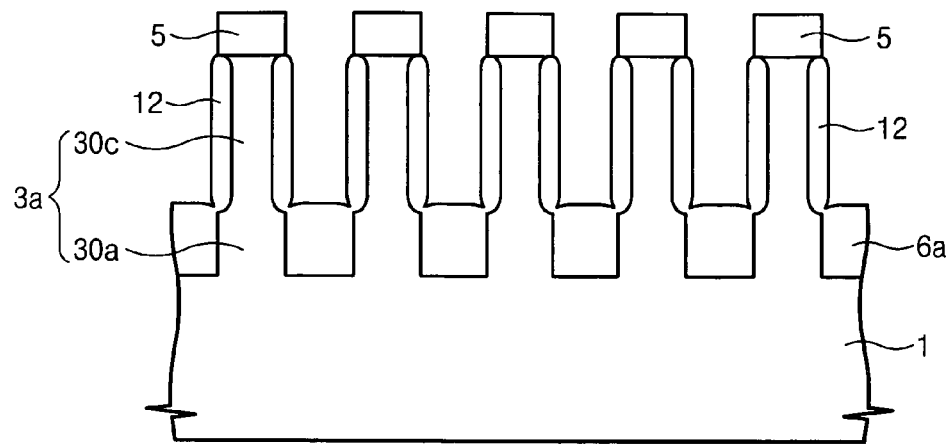
FIGS. 12A, 13A and 14A are cross-sectional views illustrating methods of forming the nonvolatile memory device of FIG. 10A according to some embodiments of the present invention.
Figure 12B:
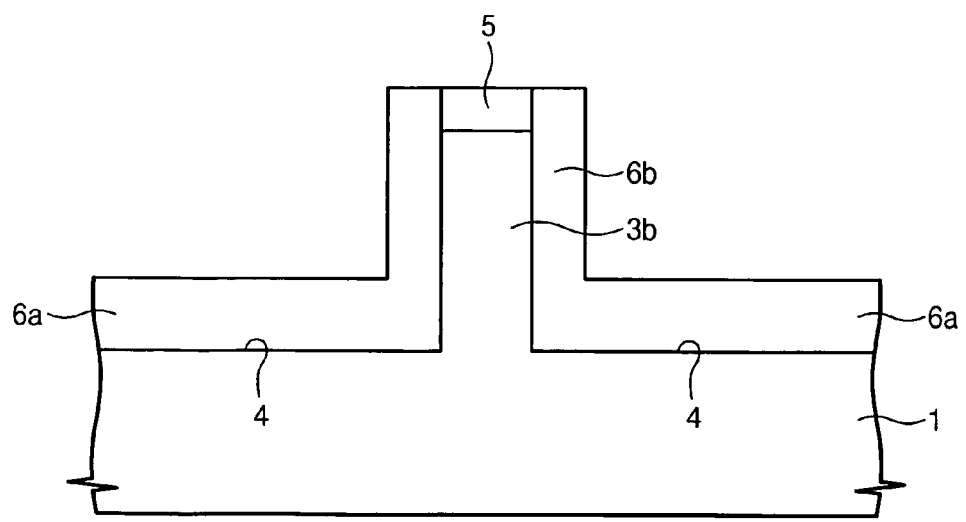
FIGS. 12B, 13B and 14B are cross-sectional views illustrating methods of forming the nonvolatile memory device of FIG. 10B according to some embodiments of the present invention.
Figure 13A:
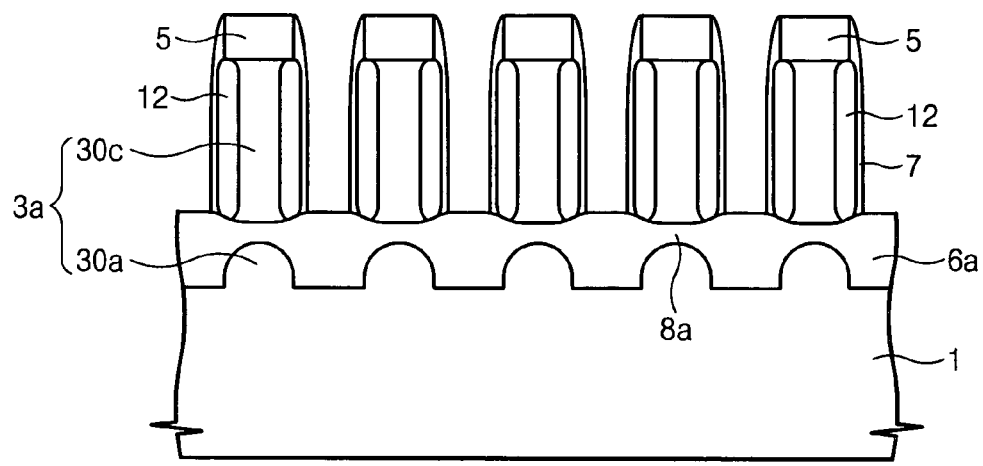
Figure 13B:
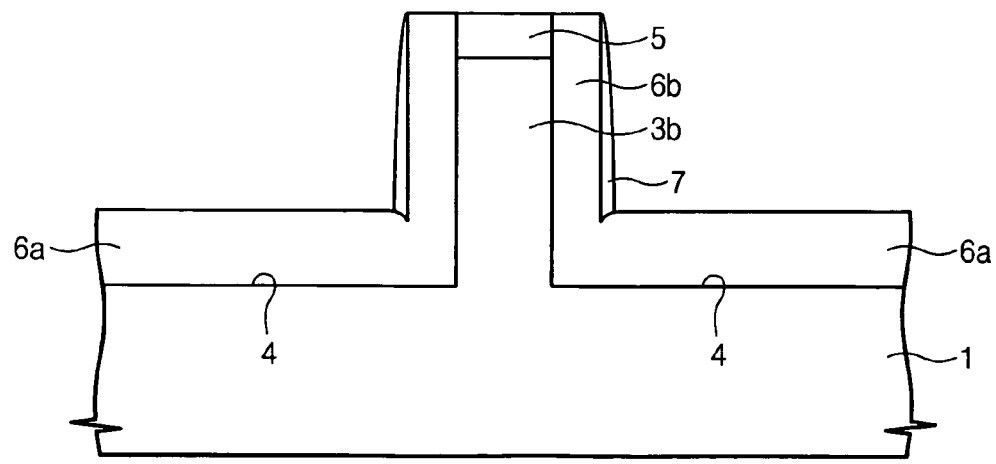
Figure 14A:
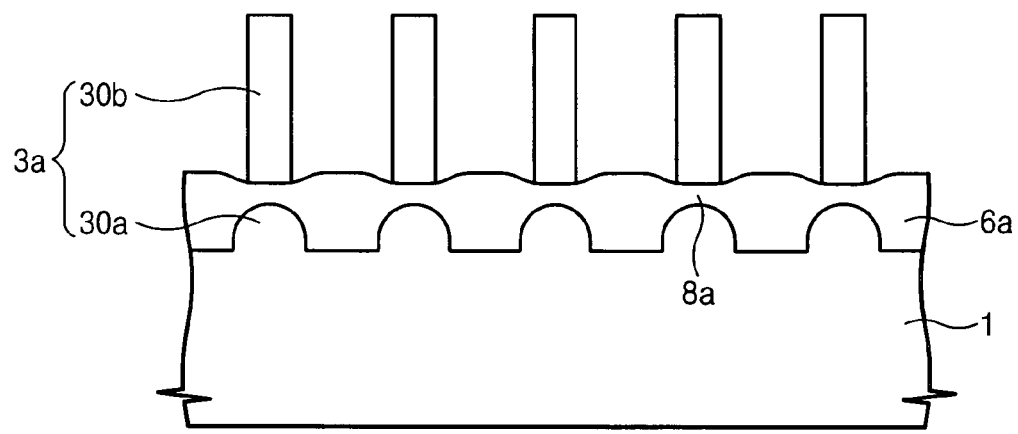
Figure 14B:
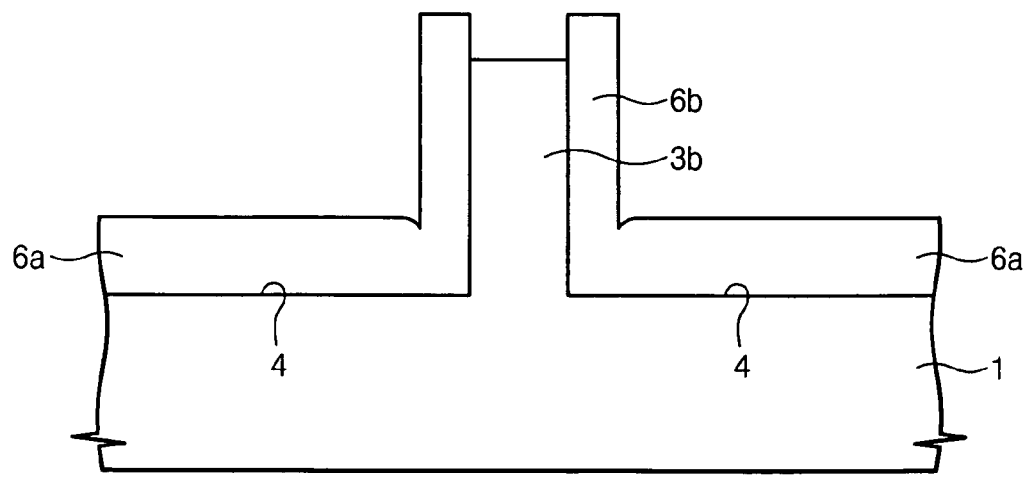

Alternatively, the nonvolatile memory device of FIGS. 10A and 10B may be formed by another method, such as by those illustrated by FIGS. 12A, 12B, 13A, 13B, 14A and 14B. FIGS. 12A, 13A and 14A are cross-sectional views illustrating methods of forming the nonvolatile memory device of FIG. 10A according to another embodiment. FIGS. 12B, 13B and 14B are cross-sectional views illustrating methods of forming the nonvolatile memory device of FIG. 10B according to another embodiment.

Referring to FIGS. 12A and 12B, after preparing the semiconductor substrate 1 having the cross-sectional structure of FIGS. 8A and 8B, a first oxidation process is performed such that the insulating layer is not formed inside the fin 3a but an oxide layer 12 is formed on the sidewall of the fin 3a, by controlling the oxidation process time.

Referring to FIGS. 13A and 13B, a spacer layer is formed over the entire surface of the semiconductor substrate 1 and is anisotropically etched, to thereby form the spacer 7. At this time, the sidewall of the oxide layer 12 is also covered with the spacer 7.

Referring to FIGS. 14A and 14B, a second oxidation process is performed to form an insulating layer 8a under the fin 3a which separates the fin 3a into the upper fin 30c and the lower fin 30a. Although the upper fin 30c becomes narrow by the oxide layer 12, the top surface is not oxidized by the first mask pattern 5. Therefore, there is no change in height. Afterwards, the first mask pattern 5, the spacer 7, and the oxide layer 12 are removed. Subsequently, as illustrated in the previous embodiments, a word line WL, a ground select line GSL, a string select line (not shown), an impurity region 22, an interlayer insulating layer 21, and a common source contact 23 are formed to provide the nonvolatile memory device of FIGS. 10A and 10B.

Figure 3D:
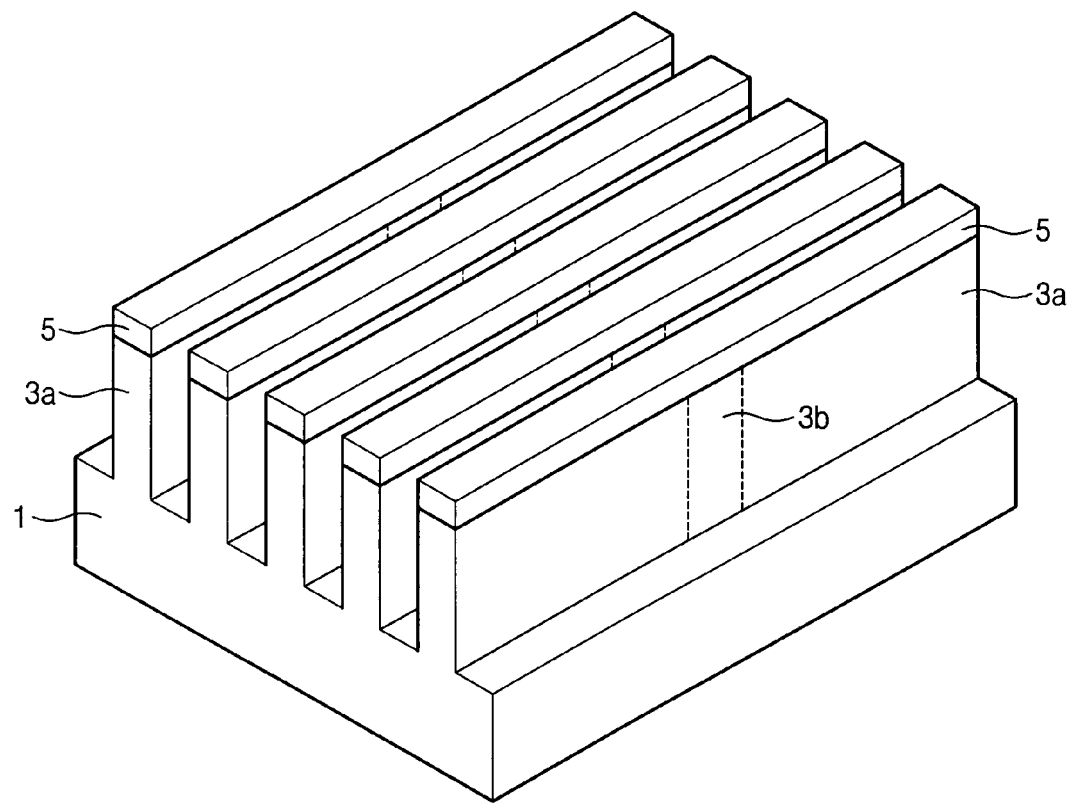
FIG. 3D is a perspective view illustrating methods of forming a fin and a fin connection part of the nonvolatile memory device of FIGS. 15 and 16 according to some embodiments of the present invention.
Figure 16:
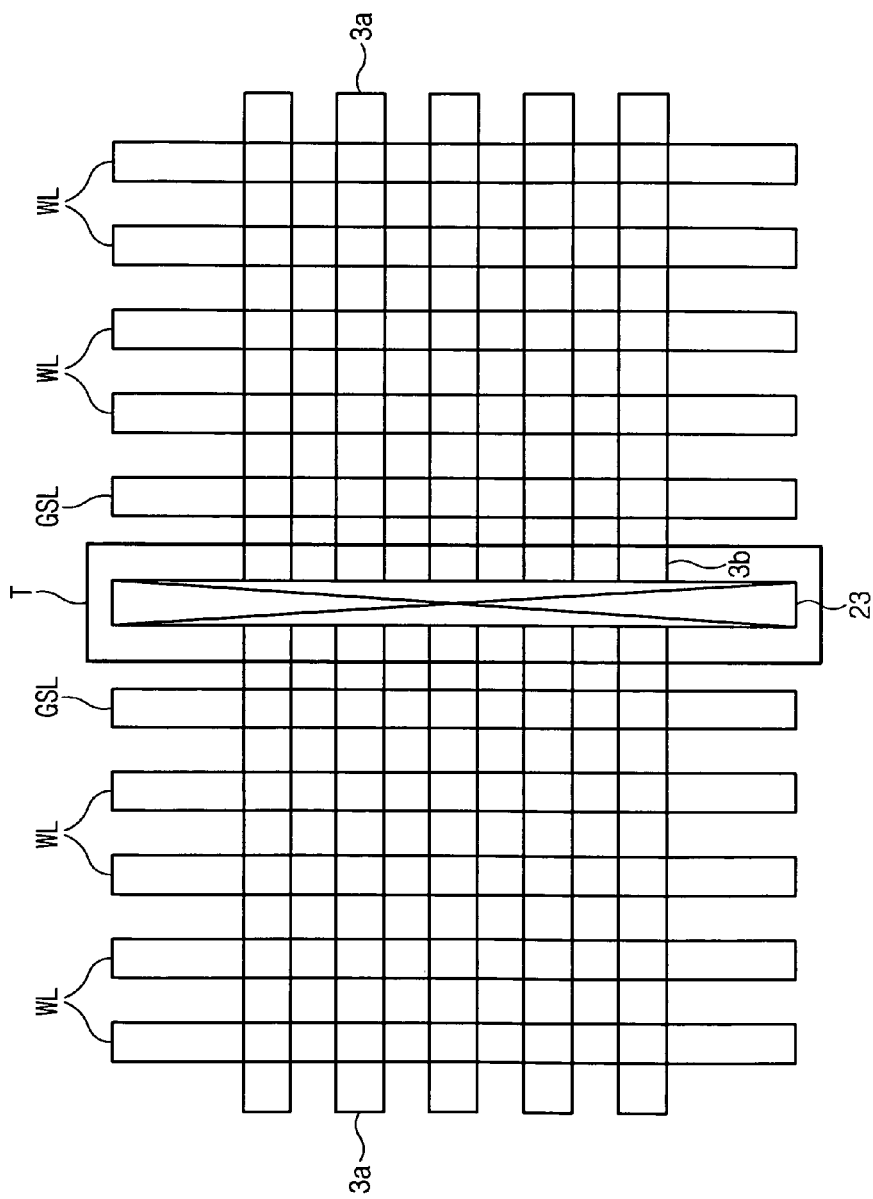
Figure 17:
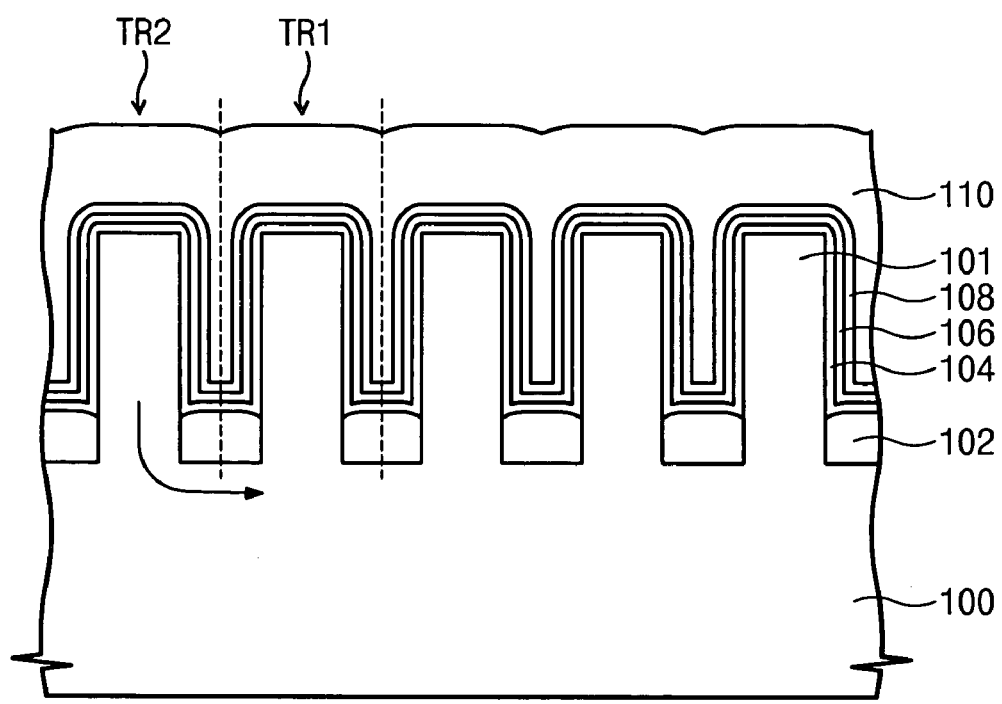
FIG. 17 is a cross-sectional view of a conventional nonvolatile memory device.

FIGS. 15 and 16 are plane views of NAND type nonvolatile memory devices according to other embodiments of the present invention. FIG. 3D is a perspective view illustrating a procedure of forming a fin and a fin connection part of the nonvolatile memory device of FIGS. 15 and 16.

Referring to FIGS. 3D, 15 and 16, active regions are formed in a different manner than that shown in FIG. 1. That is, the fins 3a are formed to have the pattern of a plurality of lines, but the fin connection parts 3b are not formed so as to cross over the fins 3a and connect to the fins 3a. The fin connection part 3b is positioned within the T zone. This fin connection part 3b may be formed by patterning the semiconductor substrate 1 using the first mask pattern 5 as an etch mask, where the first mask pattern 5 is formed in the shape of a plurality of lines. In this case, the common source contact/interconnection 23 may be formed over each fin connection part 3b as illustrated in FIG. 15, or may be formed with the shape of a line parallel to the word line WL as illustrated in FIG. 16. Although it is not illustrated in the embodiment, the insulating layer and the device isolation layer may have various shapes, such as those illustrated in the previous embodiments.

Because each of the fins are isolated by the insulating layer, adjacent FinFET device may be operated independently of one another and program disturbances may thereby be avoided. Moreover, the FinFET may be fabricated without the use of SOI, which may allow the fabrication process to be carried out more economically. The FinFET devices may be more easily electrically isolated using a very thin device isolation layer, which may allow use of these devices in highly integrated semiconductor devices having feature sized of 50 nm or less. Accordingly, these FinFET devices may be used in a nonvolatile memory device, such as a NAND type nonvolatile memory device, to reduce/avoid at least some erroneous operation conditions, such as program disturbances.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A fin field effect transistor (FinFET) comprising:
a fin that is on a substrate and extends away from the substrate;
a device isolation layer disposed on the substrate on both sides of the fin;
an insulating layer between the fin and the substrate, wherein the insulating layer is directly connected to the device isolation layer and has a different thickness than the device isolation layer;
a gate electrode that crosses over the fin;
a gate insulating layer between the gate electrode and the fin; and
source and drain regions on the fins on opposite sides of the gate electrode.

2. The FinFET of claim 1, further comprising:
a charge storage layer between the gate insulating layer and the gate electrode; and
a blocking insulating layer between the charge storage layer and the gate electrode.

3. The FinFET of claim 1, wherein a central portion of the insulating layer between the fin and the substrate is thinner than outer portions of the insulating layer adjacent to edges of the fin.

4. The FinFET of claim 1, wherein:
the fin comprises an upper fin and a lower fin aligned with one another on opposite sides of, and separated by, the insulating layer; and
the device isolation layer covers sidewalls of the lower fin.

5. The FinFET of claim 4, wherein the upper fin has the same width as the lower fin.

6. The FinFET of claim 4, wherein the upper fin is narrower than the lower fin.

7. A nonvolatile memory device comprising:
a plurality of fins on a semiconductor substrate and which extend away from the substrate and are arranged as a pattern of lines;
a device isolation layer disposed on the semiconductor substrate on both sides of each of the fins;
a tunnel insulating layer on the fins;
a charge storage layer on the tunnel insulating layer;
a blocking insulating layer on the charge storage layer;
a plurality of word lines on the blocking insulating layer and crossing over the fins;
a pair of impurity regions on each of the fins and on opposite sides of each of the word lines; and
an insulating layer between the fin and the substrate, wherein the insulating layer is directly connected to the device isolation layer and has a different thickness than the device isolation layer.

8. The nonvolatile memory device of claim 7, wherein a central portion of the insulating layer between each of the fins and the substrate is thinner than outer portions of the insulating layer adjacent to edges of the fins.

9. The nonvolatile memory device of claim 7, wherein:
each of the fins comprises an upper fin and a lower fin aligned with one another on opposite sides of, and separated by, the insulating layer; and
the device isolation layer covers sidewalls of the lower fin.

10. The nonvolatile memory device of claim 9, wherein the upper fin has the same width as the lower fin.

11. The nonvolatile memory device of claim 9, wherein the upper fin is narrower than the lower fin.

12. The nonvolatile memory device of claim 7, further comprising a fin connection part that extends from the semiconductor substrate and that has the same height as the fin, wherein the device isolation layer adjacent to the fin connection part has a top surface that is equal in height or higher than a top surface of the fin connection part.

13. The nonvolatile memory device of claim 12, wherein the insulating layer is not disposed in the fin connection part.

14. The nonvolatile memory device of claim 12, wherein the fin connection part laterally extends to directly contact adjacent fins.

15. The nonvolatile memory device of claim 14, further comprising a contact on the fin connection part that is configured to conduct a voltage thereto.

16. The nonvolatile memory device of claim 15, further comprising ground select lines and string select lines crossing over the fins and on opposite sides of the plurality of word lines, wherein the ground select line, the string select line, and the word lines form one string, and the fin connection part is between an adjacent pair of the ground select lines.

* * * * *